United States Patent [19]

Defeuilley et al.

[11] Patent Number: 4,612,516
[45] Date of Patent: Sep. 16, 1986

[54] RAPIDLY TUNABLE FREQUENCY SYNTHESIZER WITH OSCILLATOR FREQUENCY PRESETTING MEANS

[75] Inventors: Jean-Pierre Defeuilley, Cressely; Jean Nguyen-van-Nguyen, Gif sur Yvette, both of France

[73] Assignee: U.S. Philips Corporation, New York, N.Y.

[21] Appl. No.: 765,565

[22] Filed: Aug. 13, 1985

Related U.S. Application Data

[63] Continuation of Ser. No. 434,441, Oct. 14, 1982, abandoned.

[30] Foreign Application Priority Data

Oct. 16, 1981 [FR] France .............................. 81 19486

[51] Int. Cl.$^4$ .............................................. H03L 7/00
[52] U.S. Cl. .......................................... 331/11; 331/25
[58] Field of Search ........................................... 331/64

[56] References Cited

U.S. PATENT DOCUMENTS

| | | | |
|---|---|---|---|
| 3,825,855 | 7/1974 | Basset et al. ........................ | 331/1 A |
| 4,024,464 | 5/1977 | Underhill et al. ................. | 331/17 X |
| 4,105,946 | 8/1978 | Ikeda ................................ | 331/10 X |
| 4,234,929 | 11/1980 | Riley, Jr. .............................. | 331/25 |
| 4,246,547 | 1/1981 | Gerard et al. ..................... | 331/17 X |
| 4,258,333 | 3/1981 | Demuliere et al. ................... | 331/11 |
| 4,404,531 | 9/1983 | Genrich et al. ....................... | 331/64 |

FOREIGN PATENT DOCUMENTS 0002742  1/1981  Japan ..................................... 331/10

Primary Examiner—Eugene R. LaRoche
Assistant Examiner—Robert J. Pascal
Attorney, Agent, or Firm—David R. Treacy

[57] ABSTRACT

A frequency synthesizer of a type having a variable frequency divider includes a loop for locking the phase of a voltage-controlled oscillator (1), a search tuning loop in which, after a change in the displayed frequency, a digital search tuning data is formed which is converted into the control voltage for the oscillator. This synthesizer also includes translating means (9b) for translating the displayed frequency data into a digital presetting data whose values characterize sub-ranges to which the displayed frequency may belong, and means (14) for converting the said digital presetting data into a presetting voltage which is used to control the frequency of the oscillator, the values of the presetting voltage being determined to produce substantially the starting frequencies of the sub-ranges while the variation of the search tuning voltage is determined for producing a frequency variation which is substantially equal to the width of a sub-range.

8 Claims, 3 Drawing Figures

RAPIDLY TUNABLE FREQUENCY SYNTHESIZER WITH OSCILLATOR FREQUENCY PRESETTING MEANS

This is a continuation, of application Ser. No. 434,441, filed Oct. 14, 1982, now abandoned.

BACKGROUND OF THE INVENTION

The invention relates to a frequency synthesizer comprising a voltage-controlled oscillator, a divider for dividing the frequency of said oscillator, a display unit for displaying the desired frequency from which there is subtracted a digital control data of the dividing ratio of the frequency divider, a phase-locked loop comprising a phase comparator which receives the divided oscillator frequency and a reference frequency and supplies a frequency control voltage for the oscillator, a search tuning loop comprising a frequency discriminator which receives the divided frequency and the reference frequency and which supplies pulses when the frequencies are different, these pulses being counted in a counter which is automatically reset to an initial position when it reaches an end position, and converting means for converting the digital data constituted by the content of said counter into a search tuning voltage which is used to control the frequency of said oscillator.

A frequency synthesizer of the type comprising a frequency divider and a phase-locked loop and a search tuning loop is disclosed in, for example, French Patent Specification No. 2.170.908, to which U.S. Pat. No. 3,825,855 corresponds. The search tuning loop supplies, when the displayed frequency is changed, a step-wise variable search tuning voltage to have the natural frequency of the oscillator vary automatically and to adjust it to the narrow range where the phase-locked loop can become operative and lock the phase of the oscillator frequency onto a multiple of the reference frequency or a fraction of this frequency. But it will be clear that the search tuning frequency from which the desired frequency is obtained may be rather long, particularly when the frequency synthesizer must cover a large range of frequencies, whereas the automatic search tuning voltage, whose rate of variation is considerably limited, must pass through a wide range corresponding to the frequency range of the synthesizer.

SUMMARY OF THE INVENTION

The present invention has for its object to provide rapidly tunable means for a frequency synthesizer, of the type comprising a variable frequency divider.

According to the invention, in a synthesizer of this type there are provided means for translating the displayed frequency data into digital presetting data whose values characterize the sub-ranges to which the displayed frequency may belong, and means for converting the digital presetting data into a presetting voltage which is used to control the frequency of the oscillator, the values of the presetting voltage being determined for producing substantially the starting frequencies of said sub-ranges while the deviation of the search tuning voltage is determined to produce a frequency variation which is substantially equal to the width of a sub-range.

In the frequency synthesizer in accordance with the invention the oscillator is adjusted for each displayed frequency to the sub-range with which this displayed frequency is associated, so that the automatic search voltage variation necessary for the tuning needs only to cover one sub-range. This results in that the tuning can be obtained much faster than in prior art synthesizers.

It should be noted that U.S. Pat. No. 4,105,946 shows a frequency synthesizer of a different type, which does not comprise a frequency divider in the phase-locked loop. In said synthesizer, to select a frequency, the control voltage of the oscillator is acted upon in such a way that the selected frequency can be a harmonic of the reference frequency, instead of controlling the dividing ratio of the frequency divider. This known synthesizer comprises a search tuning loop and a manually operated frequency display device (of the potentiometer type) which continuously controls the control voltage of the oscillator to render the selection of a harmonic of the reference frequency possible. But said synthesizer does not contain any of the means used in accordance with the invention to increase the acquisition rate of the selected-frequency.

An advantageous embodiment of the synthesizer in accordance with the invention comprises a digital-to-analog converter whose inputs for least significant bits receive the digital data from the counter content of the search tuning loop and whose inputs for most significant bits receive the digital presetting data, the output of this converter supplying an oscillator frequency control voltage.

DESCRIPTION OF THE DRAWINGS

The following description which is given by way of example with reference to the accompanying drawings will make it better understood how the invention can be put into effect.

DESCRIPTION OF THE PREFERRED EMBODIMENTS

Figure 1:
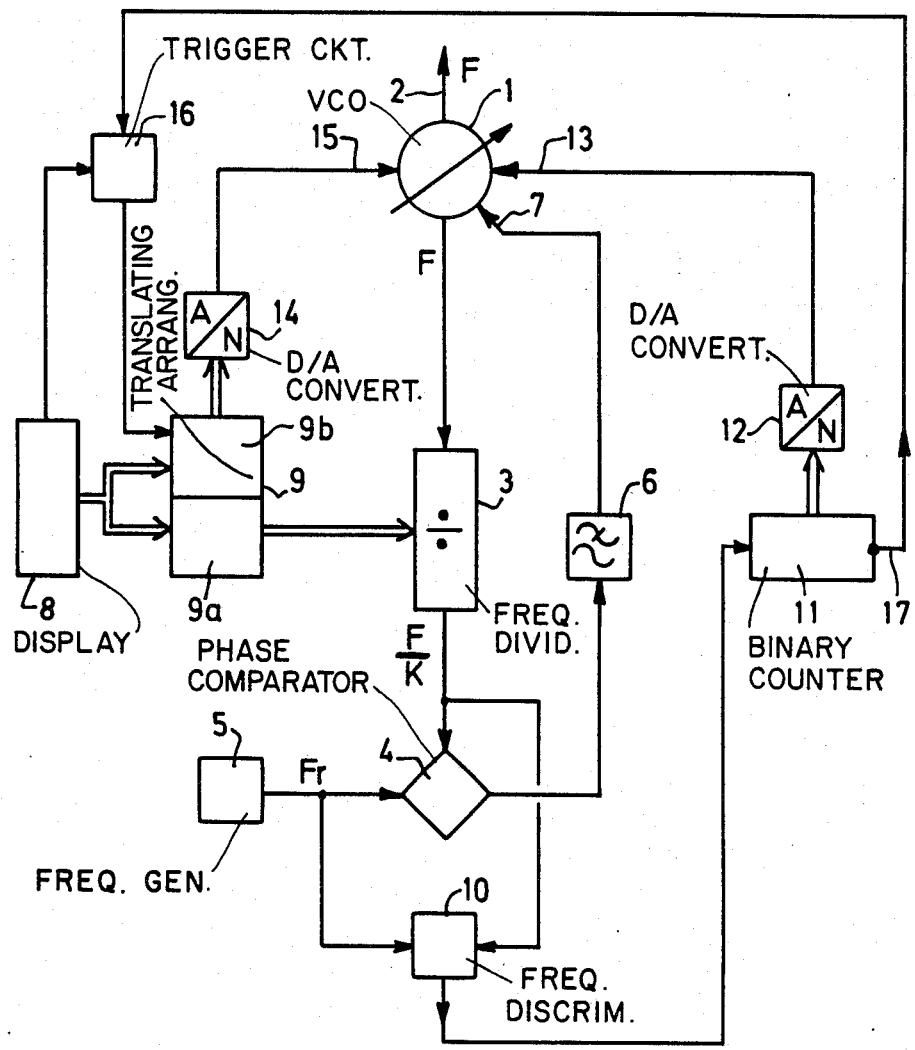
FIG. 1 shows a first embodiment of the frequency synthesizer in accordance with the invention, utilizing two digital-to-analog converters for separately converting the digital search tuning data and the presetting data.

In FIG. 1, which shows an embodiment of the frequency synthesizer in accordance with the invention, a variable-frequency, voltage-controlled oscillator 1, commonly referred to as VCO, is shown. The output frequency F of the oscillator 1 is available for use at an output 2. This output frequency F is also applied, in the form of pulses, to a pulse counter 3 which, after a cycle of K pulses, reassumes the initial position thereof and which, acting as a frequency divider, produces an output frequency $F/K$. The phase-locked loop of the synthesizer comprises a phase comparator 4, which receives the divided frequency $F/K$ and a stable reference frequency $F_r$ produced by a generator 5. A low-pass loop filter 6, connected to the output of the phase comparator 4, applies to an input 7 of the variable oscillator 1 a control voltage by means of which it is possible to correct the phase of the oscillator 1. When the phase of the oscillator has been locked, $F_r - F/K = 0$ is obtained and the output frequency F of the synthesizer is such that $F = KF_r$.

In order to obtain a given output frequency F which is an exact multiple of the reference frequency $F_r$ in the described example, the dividing ratio K must be adjusted to a predetermined value. To that effect a display unit 8 is employed on which it is possible to display a desired frequency with a step equal to the reference frequency $F_r$. This display unit supplies encoded information (for example in BCD) which is applied to a translating arrangement 9, which produces encoded data (for example in natural binary), suitable to adjust the variable divider 3 to the dividing ratio K, which corresponds to the desired frequency $F_d$. The translating arrangement 9 may, for example, be a memory, a portion 9a of which contains in different addresses the different values of the control data of the dividing ratio K, and which may be addressed by the data received from the display unit 8 to supply the control data for K.

The phase-locked loop cannot function until, in absolute value, difference between the frequencies $F_r$ and $F/K$ is very small. In order to make the phase-locked loop operative after the display of a frequency $F_d$, it is known to use a second search tuning loop by means of which it is possible to adjust the frequency F of the oscillator 1 to the narrow frequency band in which the phase-locked loop functions. This second loop comprises a frequency discriminator 10 which receives the divided frequency $F/K$ and the reference frequency $F_r$ and produces pulses when the difference between these frequencies exceeds the operating range of the phase-locked loop. The pulses produced by the frequenciy discriminator 10 are counted in a binary counter 11, which is automatically reset to an initial position after N pulses have been counted. A digital-to-analog converter 12 converts the digital data constituted by the content of the counter 11 into an analog voltage which is applied to the frequency control terminal 13 of the oscillator 1. This frequency control voltage has a minimum value corresponding to the initial position of the counter 11, increases in N steps when the counter 11 counts N pulses and finally reassumes its minimum value at the following pulse. The deviation between two consecutive steps determines a frequency variation which is less than the frequency range which allows synchronization of the phase-locked loop. When the frequency F produced by the oscillator 1 reenters the narrow frequency band which makes this synchronization possible, the phase-locked loop becomes active and locks the frequency of the oscillator 1, the frequency discriminator 10 no longer produces pulses, the counter 11 does not continue counting and the search voltage on the control terminal 13 remains constant. In prior art frequency synthesizers this automatic search tuning voltage must be capable of causing the examination of the overall frequency range of the synthesizer, which may result in too long an acquisition time of the synthesized frequency F.

In accordance with the invention, in order to reduce this acquisition time, a translation must be effected in the translating circuit 9 of the frequency data displayed in the unit 8 into a digital presetting data whose different values characterize the different sub-ranges to which the displayed frequency may belong. Assuming the translating circuit 9 to be in the form of a memory, a portion 9b of this memory may contain in different addresses the different values of the digital presetting data; by addressing the memory position 9b by means of the data received from the display unit 8, it is possible to obtain the digital presetting data at the output of 9b. This digital presetting data is converted by a digital-to-analog converter 14 into an analog presetting voltage, which is applied to a control terminal 15 of the oscillator 1 to control its frequency. The digital-to-analog converter 14 supplies, at each frequency display, a constant presetting voltage among n possible voltages, n being the number of subranges of the synthesizer. It is arranged such that the presetting voltages determine, at the output of the oscillator 1, the starting frequencies of the sub-ranges. Finally, the digital-to-analog converter 12 is arranged in such a way that the search tuning voltage variation produces, at the output of the oscillator 1, a frequency variation which is substantially equal to the width of a sub-range.

Thus, with the synthesizer in accordance with the invention, after changing the displayed frequency, the search tuning action is only effected in one sub-range from the low frequency of this sub-range, so that the rate of acquisition of the synthesized frequency is increased.

It may happen, for example due to a derivative of the natural frequency of the oscillator 1, that after a change of the displayed frequency has caused a first search tuning action in a predetermined sub-range, synchronization of the phase-locked loop has not been reached at the end of this first search action. With the system described so far, further search tuning actions, which will not beforehand determine synchronization of the phase-locked loop, will be put into operation in the same sub-range. This drawback can be obviated by a search tuning action of two consecutive sub-ranges, when tuning has not been obtained after one search in the first sub-range. For that purpose a bistable trigger circuit 16 may be used which is reset to zero by a signal coming from the display unit 8, indicating a change of the displayed frequency. This bistable trigger circuit 16 is adjusted to its operating state when at the output 17 of the counter 11, there appears a signal indicating that its final position has been reached, which signifies that a first search tuning action in a first sub-range has not furnished any result. The bistable trigger circuit 16, in the operating mode, acts on addressing of the memory 9b in such a way that the digital signal at the output of 9b represents the following sub-range. The counter 11 is simultaneously reset to the initial position, and restarts counting the pulses produced by the frequency discriminator 10. This finally results in a second search tuning action in the next sub-range. In the event that synchronization of the phase-locked loop has not been obtained at the end of this second search, the counter 11 reaches its end position and resets the bistable trigger circuit 16 to zero, which enables new search tuning actions in the two consecutive sub-ranges which were already examined. It would of course be possible to effect an automatic search tuning action of more than two consecutive sub-ranges by using, instead of the bistable trigger circuit 16, a counter having an appropriate number of positions, which progress each time the counter 11 reaches its final position and acts each time on the addressing of the memory 9b in such a way that the digital signal at the output of 9b represents a subsequent sub-range.

Figure 2:
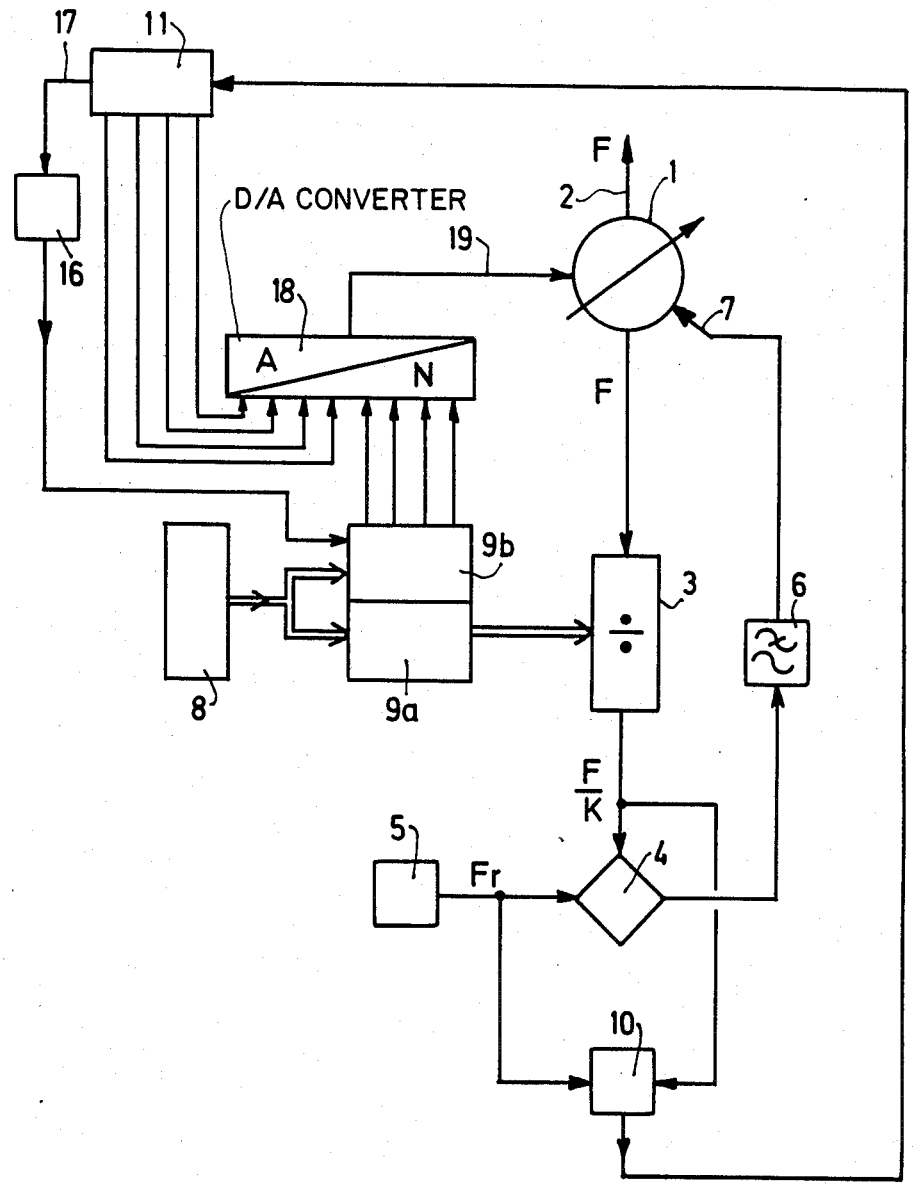
FIG. 2 shows a second embodiment of the synthesizer in accordance with the invention in which the digital search tuning data and the presetting data are combined at the input of a single digital-to-analog converter.

FIG. 2 shows an advantageous embodiment of the synthesizer in accordance with the invention, from which one digital-to-analog converter may be omitted and with which the search tuning action can be easily realized in a region which is actually equal to the spacing between the preset frequencies. The elements of FIG. 2 corresponding to the elements of FIG. 1 have been given the same reference numerals. The synthesizer shown in FIG. 2 differs from the synthesizer of FIG. 1 in that the digital search tuning data supplied by the counter 11 and the digital presetting data supplied by the memory 9b are combined at the input of a digital-to-analog converter 18, instead of being applied to the two digital-to-analog converters 12 and 14. The output of the digital-to-analog converter 18 is connected to a control terminal 19, which replaces the two control terminals 13 and 15 of the oscillator 1 shown in FIG. 1. The combination of the two digital data is realized by applying the bits of the presetting data (for example 4 bits) to the most significant input of the converter 18 and the bits of the search tuning data (for example 4 bits) to the least significant inputs of this converter 18. After a change of the displayed frequency, there is obtained, at the control terminal 19 of the oscillator, a voltage which increases step-wise from the presetting voltage corresponding to the display 8 and by means of which it is possible to cover accurately the frequency range from the beginning of a sub-range to the beginning of the next sub-range. It is equally possible to use, in the synthesizer shown in FIG. 2 a bistable trigger circuit 16 having the same function as in the synthesizer shown in FIG. 1, to permit a search tuning action of two consecutive sub-ranges.

Figure 3:
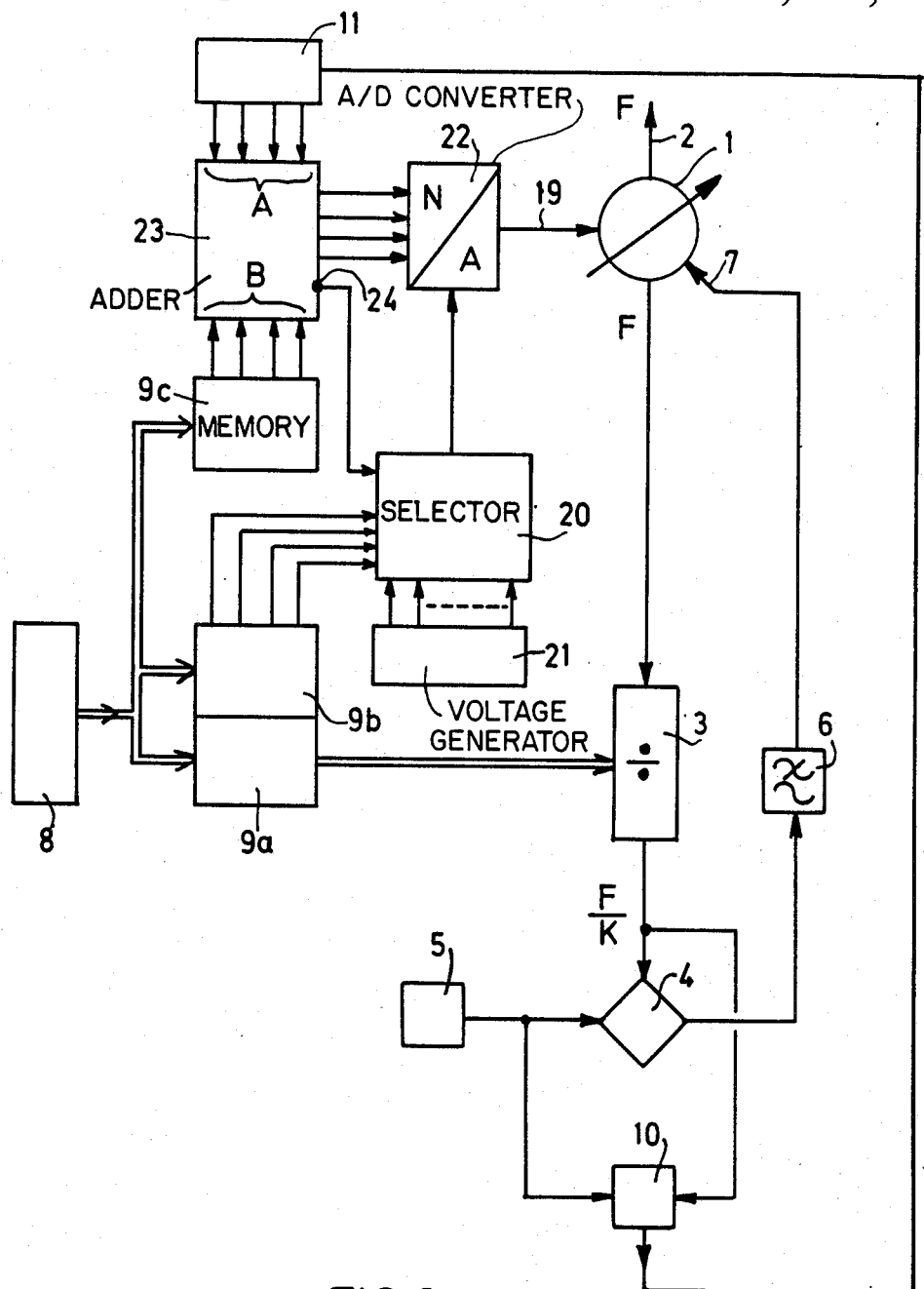
FIG. 3 shows a third embodiment of the synthesizer in accordance with the invention comprising a different means for combining the digital search tuning data and the digital presetting data.

A further embodiment of the synthesizer in accordance with the invention is shown in FIG. 3 in which elements shown already in the FIGS. 1 and 2 have been given the same reference numerals. In the synthesizer of FIG. 3 the digital presetting data supplied by the memory 9b is applied to a selector 20 for selecting one of the direct voltages appearing at the outputs of a voltage generator 21. These direct voltages are the presetting voltages which render it possible to produce the starting frequencies of the relevant sub-ranges. The direct presetting voltage selected by the selector 20 is conveyed to an analog-to-digital converter 22 in which it is used as a pedestal level at the converted voltage formed by this converter 22. The output of the converter 22 is connected to the frequency control terminal 19 of the oscillator 1. A digital sum signal formed by an adder circuit 23 is adplied to the input of the converter 22. This adder circuit receives the variable number A (having, for example, 4 bits) supplied by the counter 11 and representing the search tuning data and also a number B (also having, for example, 4 bits) supplied by a memory 9c in response to the displayed frequency data and depending on the region in which, within a sub-range, the selected frequency is located. In the example chosen here, the adder circuit 23 applies 4-bit numbers to the converter 22. At a terminal 24 of the adder circuit 23 there appears an additional bit which is applied to the selector 20 for selecting the direct presetting voltage which immediately follows after the voltage selected by means of memory 9b. This additional bit may, for example, be the carry bit of the sum of every 4 bits formed by the adder circuit 23.

It is obvious that the beginning of the search tuning action, determined by the variable number A is shifted relative to the beginning of a sub-range, by a value depending on the number D; with numbers B which are suitably chosen as a function of the region of the sub-range to which the selected frequency belongs it is therefore possible to begin the search in this region and to obtain tuning more rapidly. The carry bit appearing at the output 24 of the adder circuit 23 has for its object to prolong the frequency tuning in the sub-range in accordance with which it has been selected by the memory 9b. This prolongation may be necessary when the selected frequency is located in the high region of a sub-range. When the selected frequency is located in the lower region of a sub-range this prolongation is not necessary. It may be advantageous in certain cases for the additional bit, appearing at the output 24 of the adder circuit 23, not to be the real carry bit of the sum of every 4 bits (that is to say when this sum reaches 16), but rather a bit which appears when the sum of more than 4 bits attains a certain value (for example 20).

What is claimed is:

1. In a frequency synthesizer comprising a voltage-controlled oscillator, a variable divider for dividing the output frequency of said oscillator, a display unit for displaying a desired frequency from which there is derived a digital control data representing the dividing ratio of said variable divider, a phrase comparator which receives the divided oscillator frequency and a reference frequency and supplies a frequency control voltage for said oscillator, and a search tuning loop comprising a frequency discriminator which receives the divided oscillator frequency and the reference frequency and which supplies pulses when these frequencies are different, a counter for counting these pulses, said counter being automatically reset to an initial position thereof when said counter reaches an end position thereof, and converting means for converting the digital data representing the count of said counter into a search tuning voltage for controlling the frequency of said oscillator, whereby the search tuning voltage repetitively scans a given voltage range in response to said pulses; the improvement wherein said frequency synthesizer further comprises means for translating the displayed frequency into digital presetting data whose values represent frequency sub-ranges to which the displayed frequency may belong, said converting means comprising means for converting the digital presetting data into a presetting voltage for controlling the frequency of said oscillator, the values of the presetting voltage being selected to produce substantially the starting frequencies of the sub-ranges while the variation of the search tuning voltage is selected to produce a frequency variation substantially equal to the width of a sub-range, said converting means further comprising means responsive to a determined change in said scanning voltage for changing the sub-range within which the frequency of said oscillator is scanned by said search tuning voltage.

2. A frequency synthesizer as claimed in claim 1, wherein said converting means comprises a first digital-to-analog converter for converting the digital data of the content of said counter of the search tuning loop into the search tuning voltage for said oscillator, and a second digital-to-analog converter for converting the digital presetting data into the presetting voltage for said oscillator.

3. A frequency synthesizer as claimed in claim 1, wherein said converting means comprises a single digital-to-analog converter having least significant bit inputs for receiving the digital data of the contents of said counter of the search tuning loop and most significant bit inputs for receiving the digital presetting data, the output of this converter producing a frequency control voltage for said oscillator.

4. A frequency synthesizer as claimed in claim 2, it further comprising an arrangement which can be driven to at least two positions and which is caused to change-over from one position to the next position by said counter of the search tuning loop when said counter reaches the end position thereof, this arrangement acting on said means for translating the displayed frequency data so that said translating means provides the digital presetting data corresponding to a subsequent sub-range after change-over of said arrangement.

5. A frequency synthesizer as claimed in claim 4, characterized in that said arrangement which can be driven to at least two positions is a two-position bistable multivibrator.

6. A frequency synthesizer as claimed in claim 3, further comprising an arrangement which can be driven to at least two positions and which is caused to change-over from one position to the next position by said counter of the search tuning loop when said counter reaches the end position thereof, this arrangement acting on said means for translating the displayed frequency data so that said translating means provides the digital presetting data corresponding to a subsequent sub-range after change-over of said arrangement.

7. A frequency synthesizer as claimed in claim 6, wherein said arrangement which can be driven to at least two positions is a two-position bistable multivibrator.

8. A frequency synthesizer comprising a voltage-controlled oscillator, a variable divider for dividing the output frequency of said oscillator, a display unit for displaying a desired frequency from which there is derived a digital control data representing the dividing ratio of said variable divider, a phase comparator which receives the divided oscillator frequency and a reference frequency and supplies a frequency control voltage for said oscillator, a search tuning loop comprising a frequency discriminator which receives the divided oscillator frequency and the reference frequency and which supplies pulses when these frequencies are different, and a counter for counting these pulses, the content of said counter constituting digital data; said counter being automatically reset to an initial position thereof when said counter reaches an end position thereof, characterized in that said frequency synthesizer further comprises means for translating the displayed frequency into digital presetting data whose values characterize sub-ranges to which the displayed frequency may belong, a digital-to-analog converter for supplying a control voltage for said oscillator in addition to the frequency control voltage supplied by the phase comparator, generator means for providing a plurality of presetting voltages, a selector for selecting, as a function of the digital presetting data, one of the presetting voltages which corresponds to the sub-range to which the displayed frequency belongs, the selected presetting voltage being used as a pedestal level of the output voltage of said digital-to-analog converter, means for converting the displayed frequency into an additional digital data representing a region to which the displayed frequency belongs within a sub-range, and an adder circuit for receiving the digital data of the content of said counter of the search tuning loop and also the additional digital data of said converting means of the displayed frequency, said adder circuit supplying at a first output a sum signal which is applied to the input of said digital-to-analog converter and at a second output a signal which indicates a carry of this sum, which signal is applied to said selector for selecting the presetting voltage corresponding to the sub-range which follows after the sub-range to which the displayed frequency belongs.

* * * * *